(12) United States Patent
Haines et al.

(10) Patent No.: US 7,188,942 B2
(45) Date of Patent: *Mar. 13, 2007

(54) FILTER FOR PRINTHEAD ASSEMBLY

(75) Inventors: Mark Haines, Lebanon, OR (US);
Mark A. Devries, Albany, OR (US);
Rhonda Wilson, Monmouth, OR (US);
Craig Malik, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 219 days.

This patent is subject to a terminal disclaimer.

(21) Appl. No.: 10/635,409

(22) Filed: Aug. 6, 2003

(65) Prior Publication Data

US 2005/0030358 A1 Feb. 10, 2005

(51) Int. Cl.
*B41J 2/175* (2006.01)
*B41J 2/05* (2006.01)

(52) U.S. Cl. .............. 347/93; 347/66; 347/85

(58) Field of Classification Search ........... 347/66, 347/65, 84, 85, 86, 87, 67, 63, 56, 55, 54, 347/47, 40, 20, 9, 5, 1, 7, 92, 93
See application file for complete search history.

(56) References Cited

U.S. PATENT DOCUMENTS

| | | | |
|---|---|---|---|
| 4,788,556 A * | 11/1988 | Hoisington et al. | ........... 347/92 |
| 5,016,023 A | 5/1991 | Chan et al. | |
| 5,057,854 A | 10/1991 | Pond et al. | |
| 5,079,189 A | 1/1992 | Drake et al. | |
| 5,098,503 A | 3/1992 | Drake | |
| 5,160,945 A | 11/1992 | Drake | |
| 5,426,459 A | 6/1995 | Kaplinsky | |
| 5,469,199 A | 11/1995 | Allen et al. | |
| 5,481,289 A * | 1/1996 | Arashima et al. | ............. 347/93 |
| 5,489,930 A | 2/1996 | Anderson | |
| 5,546,109 A * | 8/1996 | Nakano | ....................... 347/93 |
| 5,565,900 A | 10/1996 | Cowger et al. | |
| 5,696,544 A | 12/1997 | Komuro | |
| 5,742,305 A | 4/1998 | Hackleman | |
| 5,748,215 A | 5/1998 | Swanson et al. | |
| 5,939,206 A | 8/1999 | Kneezel et al. | |
| 5,969,739 A | 10/1999 | Altendorf et al. | |
| 6,086,195 A | 7/2000 | Bohorquez et al. | |
| 6,123,410 A | 9/2000 | Beerling et al. | |
| 6,250,738 B1 | 6/2001 | Waller et al. | |
| 6,322,206 B1 | 11/2001 | Boyd et al. | |
| 6,341,845 B1 | 1/2002 | Scheffelin et al. | |

(Continued)

OTHER PUBLICATIONS

Ross R. Allen, "Inkjet Printing with Large Pagewide Arrays: Issues and Challenges", Recent Progress in Ink Jet Technologies II, pp. 114-120; originally published in "12th International Congress on Advances in Non-Impact Printing Technologies Proc.", p. 43, 1996.

*Primary Examiner*—Stephen Meier
*Assistant Examiner*—Geoffrey Mruk (57) ABSTRACT

A filter for a printhead assembly includes a frame having an opening and a fluid passage communicated with the opening formed therein, filter material enclosing the opening and the fluid passage of the frame, a first fluid port communicated with the fluid passage of the frame, a permeable material communicated with the first fluid port, and a second fluid port spaced from the first fluid port and communicated with the fluid passage of the frame.

23 Claims, 10 Drawing Sheets

U.S. PATENT DOCUMENTS 6,343,857 B1  2/2002  Cowger
6,398,357 B1  6/2002  Holloway et al.
6,431,683 B1  8/2002  Ho et al.
6,435,653 B1  8/2002  Boyd et al.

* cited by examiner

FILTER FOR PRINTHEAD ASSEMBLY

CROSS-REFERENCE TO RELATED APPLICATIONS

This application is related to U.S. patent application Ser. No. 10/635,636, fled on Aug. 6, 2003, assigned to the assignee, of the present invention, and incorporated herein by reference.

BACKGROUND

A conventional inkjet printing system includes a printhead, an ink supply which supplies liquid ink to the printhead, and an electronic controller which controls the printhead. The printhead ejects ink drops through a plurality of orifices or nozzles and toward a print medium, such as a sheet of paper, so as to print onto the print medium. Typically, the nozzles are arranged in one or more arrays such that properly sequenced ejection of ink from the nozzles causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single carrier. As such, a number of nozzles and, therefore, an overall number of ink drops which can be ejected per second is increased. Since the overall number of ink drops which can be ejected per second is increased, printing speed can be increased with the wide-array inkjet printing system.

During filling and/or operation of the printhead, air may accumulate within the printhead. For example, as the printhead is filled with liquid ink, displaced air will exist. In addition, with different orientations of the printhead, the internal geometry of the printhead may create dead zones within the printhead where air can become trapped. Unfortunately, the accumulation of air within the printhead may adversely effect operation of the printhead.

For these and other reasons, there is a need for the present invention.

SUMMARY

One aspect of the present invention provides a filter for a printhead assembly. The filter includes a frame having an opening and a fluid passage communicated with the opening formed therein, filter material enclosing the opening and the fluid passage of the frame, a first fluid port communicated with the fluid passage of the frame, a permeable material communicated with the first fluid port, and a second fluid port spaced from the first fluid port and communicated with the fluid passage of the frame.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
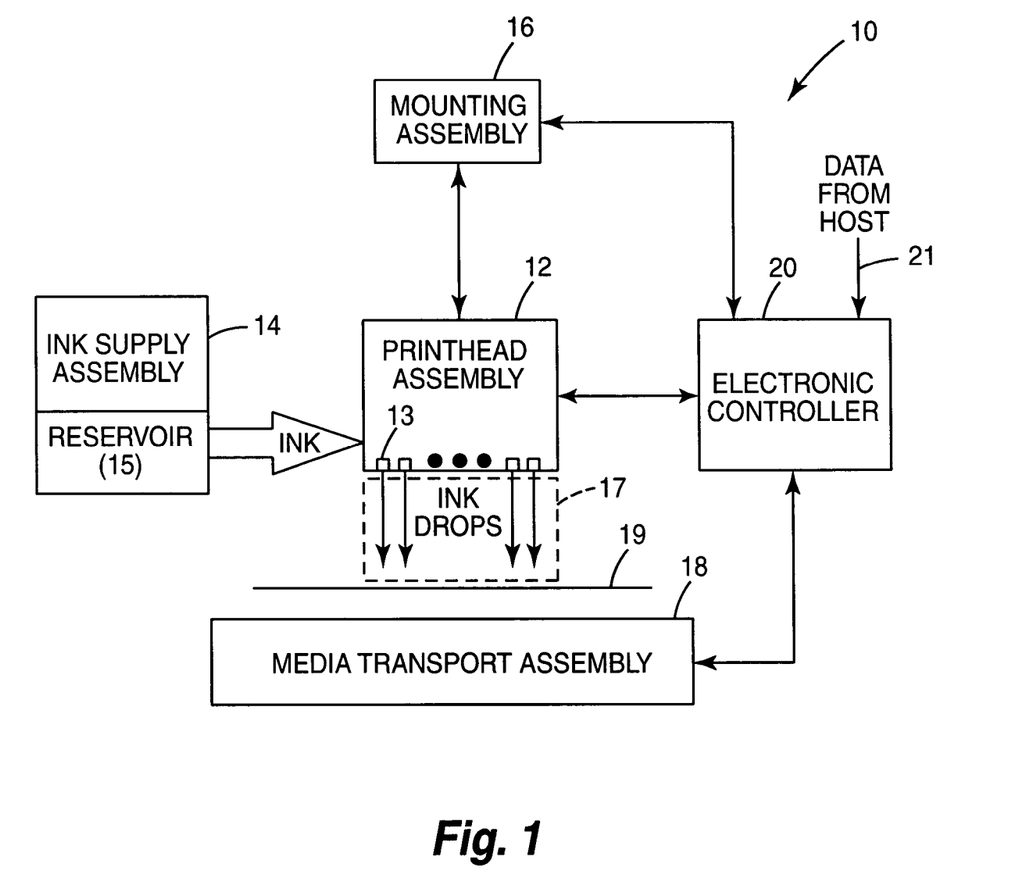
FIG. 1 is a block diagram illustrating one embodiment of an ink-jet printing system.

FIG. 1 illustrates one embodiment of an inkjet printing system 10. Inkjet printing system 10 includes a printhead assembly 12, an ink supply assembly 14, a mounting assembly 16, a media transport assembly 18, and an electronic controller 20. Printhead assembly 12 is formed according to an embodiment of the present invention, and includes one or more printheads which eject drops of ink or fluid through a plurality of orifices or nozzles 13.

In one embodiment, the drops of ink are directed toward a medium, such as print medium 19, so as to print onto print medium 19. Print medium 19 includes any type of suitable sheet material, such as paper, card stock, transparencies, Mylar, and the like. Typically, nozzles 13 are arranged in one or more columns or arrays such that properly sequenced ejection of ink from nozzles 13 causes, in one embodiment, characters, symbols, and/or other graphics or images to be printed upon print medium 19 as printhead assembly 12 and print medium 19 are moved relative to each other.

Ink supply assembly 14 supplies ink to printhead assembly 12 and includes a reservoir 15 for storing ink. As such, in one embodiment, ink flows from reservoir 15 to printhead assembly 12. In one embodiment, printhead assembly 12 and ink supply assembly 14 are housed together in an ink-jet cartridge or pen. In another embodiment, ink supply assembly 14 is separate from printhead assembly 12 and supplies ink to printhead assembly 12 through an interface connection, such as a supply tube.

Mounting assembly 16 positions printhead assembly 12 relative to media transport assembly 18 and media transport assembly 18 positions print medium 19 relative to printhead assembly 12. Thus, a print zone 17 is defined adjacent to nozzles 13 in an area between printhead assembly 12 and print medium 19. In one embodiment, printhead assembly 12 is a scanning type printhead assembly and mounting assembly 16 includes a carriage for moving printhead assembly 12 relative to media transport assembly 18. In another embodiment, printhead assembly 12 is a non-scanning type printhead assembly and mounting assembly 16 fixes printhead assembly 12 at a prescribed position relative to media transport assembly 18.

Electronic controller 20 communicates with printhead assembly 12, mounting assembly 16, and media transport assembly 18. Electronic controller 20 receives data 21 from a host system, such as a computer, and includes memory for temporarily storing data 21. Typically, data 21 is sent to ink-jet printing system 10 along an electronic, infrared, optical or other information transfer path. Data 21 represents, for example, a document and/or file to be printed. As such, data 21 forms a print job for inkjet printing system 10 and includes one or more print job commands and/or command perimeters.

In one embodiment, electronic controller 20 provides control of printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops is determined by the print job commands and/or command perimeters. In one embodiment, logic and drive circuitry forming a portion of electronic controller 20 is located on printhead assembly 12. In another embodiment, logic and drive circuitry is located off printhead assembly 12.

Figure 2:
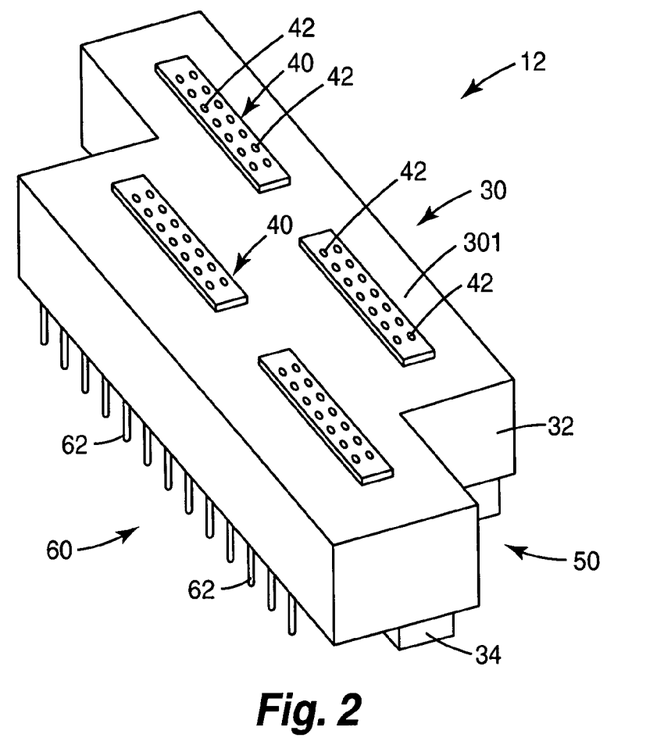
FIG. 2 is a top perspective view illustrating one embodiment of a printhead assembly.
Figure 3:
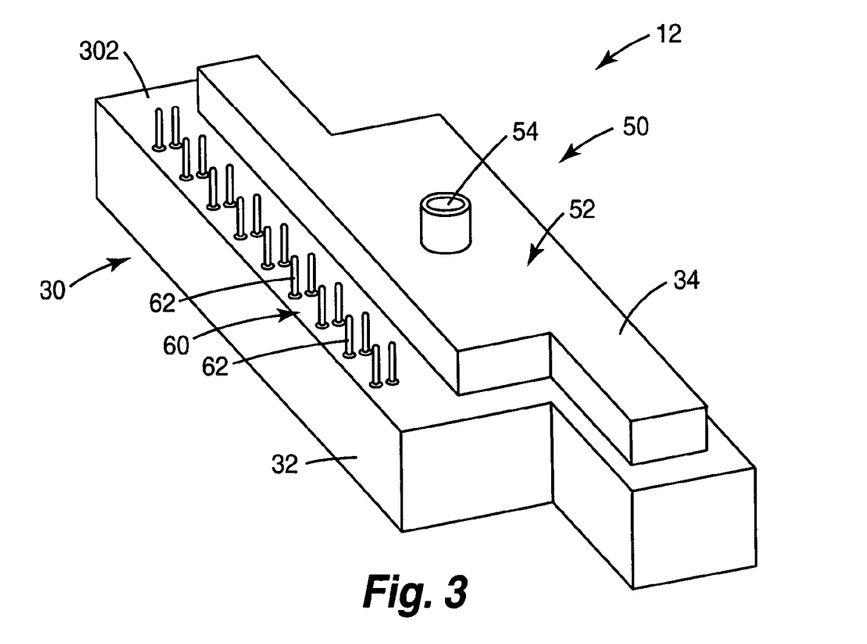
FIG. 3 is a bottom perspective view of the printhead assembly of FIG. 2.

FIGS. 2 and 3 illustrate one embodiment of a portion of printhead assembly 12. Printhead assembly 12 is a wide-array or multi-head printhead assembly and includes a carrier 30, a plurality of printhead dies 40, an ink or fluid delivery system 50, and an electronic interface system 60. Carrier 30 has an exposed surface or first face 301 and an exposed surface or second face 302 which is opposite of and oriented substantially parallel with first face 301. Carrier 30 serves to carry or provide mechanical support for printhead dies 40. In addition, carrier 30 accommodates fluidic communication between ink supply assembly 14 and printhead dies 40 via ink delivery system 50 and accommodates electrical communication between electronic controller 20 and printhead dies 40 via electronic interface system 60.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, printhead assembly 12 may span a nominal page width or a width shorter or longer than nominal page width. While four printhead dies 40 are illustrated as being mounted on carrier 30, the number of printhead dies 40 mounted on carrier 30 may vary.

In one embodiment, a plurality of inkjet printhead assemblies 12 are mounted in an end-to-end manner. In one embodiment, to provide for at least one printhead die 40 of one printhead assembly 12 overlapping at least one printhead die 40 of an adjacent printhead assembly 12, carrier 30 has a staggered or stair-step profile. While carrier 30 is illustrated as having a stair-step profile, it is within the scope of the present invention for carrier 30 to have other profiles including a substantially rectangular profile.

Ink delivery system 50 fluidically couples ink supply assembly 14 with printhead dies 40. In one embodiment, ink delivery system 50 includes a fluid manifold 52 and a fluid port 54. Fluid manifold 52 is formed in carrier 30 and distributes ink through carrier 30 to each printhead die 40. Fluid port 54 communicates with fluid manifold 52 and provides an inlet for ink supplied by ink supply assembly 14.

Electronic interface system 60 electrically couples electronic controller 20 with printhead dies 40. In one embodiment, electronic interface system 60 includes a plurality of electrical contacts 62 which form input/output (I/O) contacts for electronic interface system 60. As such, electrical contacts 62 provide points for communicating electrical signals between electronic controller 20 and printhead assembly 12. Examples of electrical contacts 62 include I/O pins which engage corresponding I/O receptacles electrically coupled to electronic controller 20 and I/O contact pads or fingers which mechanically or inductively contact corresponding electrical nodes electrically coupled to electronic controller 20. Although electrical contacts 62 are illustrated as being provided on second face 302 of carrier 30, it is within the scope of the present invention for electrical contacts 62 to be provided on other sides of carrier 30.

Figure 4:
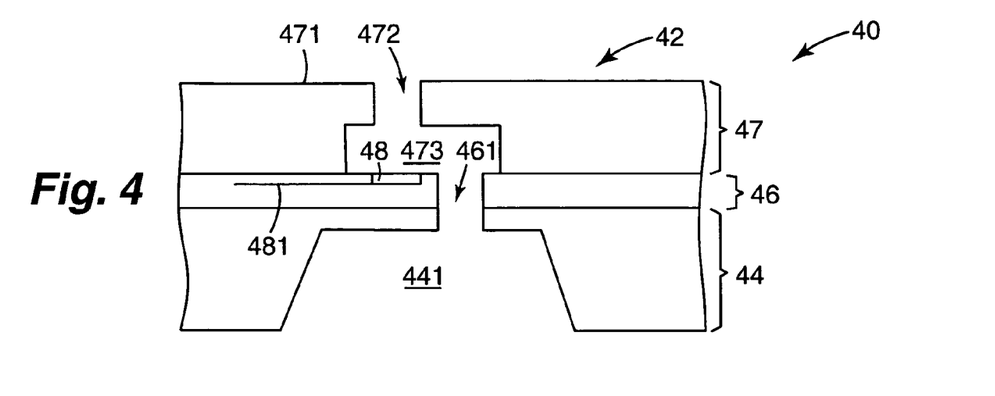
FIG. 4 is a schematic cross-sectional view illustrating portions of one embodiment of a printhead die.

As illustrated in the embodiments of FIGS. 2 and 4, each printhead die 40 includes an array of drop ejecting elements 42. Drop ejecting elements 42 are formed on a substrate 44 which has an ink or fluid feed slot 441 formed therein. As such, fluid feed slot 441 provides a supply of ink or fluid to drop ejecting elements 42. Substrate 44 is formed, for example, of silicon, glass, or a stable polymer.

In one embodiment, each drop ejecting element 42 includes a thin-film structure 46 and an orifice layer 47. Thin-film structure 46 includes a firing resistor 48 and has an ink or fluid feed channel 461 formed therein which communicates with fluid feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and fluid feed channel 461 of thin-film structure 46. Firing resistor 48 is positioned within nozzle chamber 473 and includes leads 481 which electrically couple firing resistor 48 to a drive signal and ground.

Thin-film structure 46 is formed, for example, by one or more passivation or insulation layers of silicon dioxide, silicon carbide, silicon nitride, tantalum, poly-silicon glass, or other suitable material. In one embodiment, thin-film structure 46 also includes a conductive layer which defines firing resistor 48 and leads 481. The conductive layer is formed, for example, by aluminum, gold, tantalum, tantalum-aluminum, or other metal or metal alloy.

In one embodiment, during operation, ink or fluid flows from fluid feed slot 441 to nozzle chamber 473 via fluid feed channel 461. Nozzle opening 472 is operatively associated with firing resistor 48 such that droplets of ink or fluid are ejected from nozzle chamber 473 through nozzle opening 472 (e.g., normal to the plane of firing resistor 48) and toward a medium upon energization of firing resistor 48.

Example embodiments of printhead dies 40 include a thermal printhead, as described above, a piezoelectric printhead, a flex-tensional printhead, or any other type of fluid ejection device known in the art. In one embodiment, printhead dies 40 are fully integrated thermal inkjet printheads.

Figure 5:
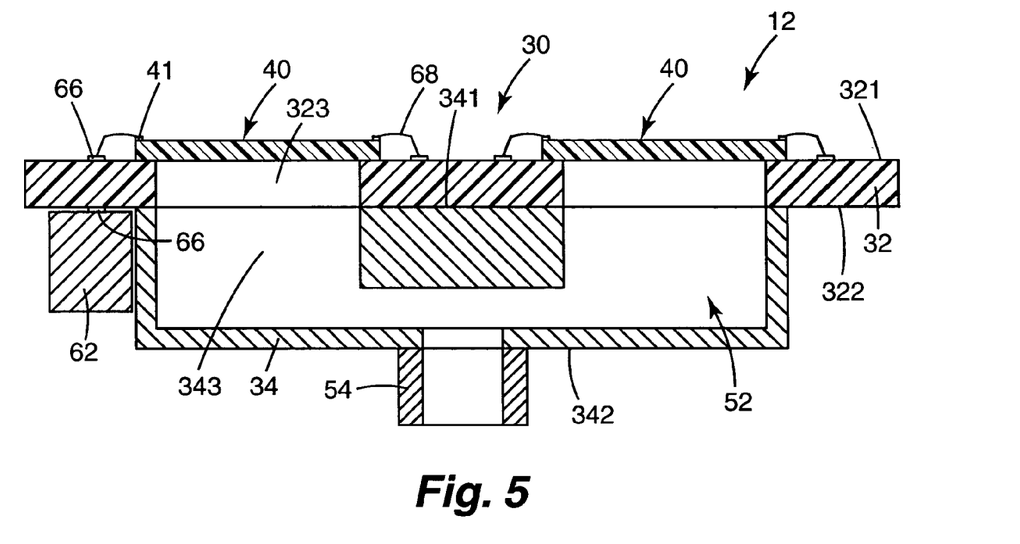
FIG. 5 is a schematic cross-sectional view illustrating one embodiment of a printhead assembly.

Referring to the embodiments of FIGS. 2, 3, and 5, carrier 30 includes a substrate 32 and a substructure 34. Substrate 32 and substructure 34 provide and/or accommodate mechanical, electrical, and fluidic functions of printhead assembly 12. More specifically, substrate 32 provides mechanical support for printhead dies 40, accommodates fluidic communication between ink supply assembly 14 and printhead dies 40 via ink delivery system 50, and provides electrical connection between and among printhead dies 40 and electronic controller 20 via electronic interface system 60. Substructure 34 provides mechanical support for substrate 32, accommodates fluidic communication between ink supply assembly 14 and printhead dies 40 via ink delivery system 50, and accommodates electrical connection between printhead dies 40 and electronic controller 20 via electronic interface system 60.

Substrate 32 has a first side 321 and a second side 322 which is opposite first side 321, and substructure 34 has a first side 341 and a second side 342 which is opposite first side 341. In one embodiment, printhead dies 40 are mounted on first side 321 of substrate 32 and substructure 34 is disposed on second side 322 of substrate 32. As such, first side 341 of substructure 34 contacts and is joined to second side 322 of substrate 32.

For transferring ink between ink supply assembly 14 and printhead dies 40, substrate 32 and substructure 34 each have a plurality of ink or fluid passages 323 and 343, respectively, formed therein. Fluid passages 323 extend through substrate 32 and provide a through-channel or through-opening for delivery of ink to printhead dies 40 and, more specifically, fluid feed slot 441 of substrate 44 (FIG. 4). Fluid passages 343 extend through substructure 34 and provide a through-channel or through-opening for delivery of ink to fluid passages 323 of substrate 32. As such, fluid passages 323 and 343 form a portion of ink delivery system 50. Although only one fluid passage 323 is shown for a given printhead die 40, there may be additional fluid passages to the same printhead die, for example, to provide ink of respective differing colors.

Figure 6:
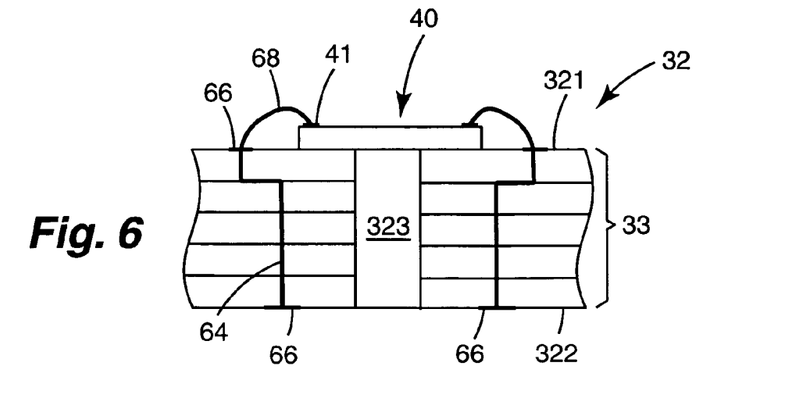
FIG. 6 is a schematic cross-sectional view illustrating one embodiment of a portion of a substrate for a printhead assembly.

For transferring electrical signals between electronic controller 20 and printhead dies 40, electronic interface system 60 includes a plurality of conductive paths 64 extending through substrate 32, as illustrated in FIG. 6. More specifically, substrate 32 includes conductive paths 64 which pass through and terminate at exposed surfaces of substrate 32. In one embodiment, conductive paths 64 include electrical contact pads 66 at terminal ends thereof which form, for example, I/O bond pads on substrate 32. Conductive paths 64, therefore, terminate at and provide electrical coupling between electrical contact pads 66.

Electrical contact pads 66 provide points for electrical connection to substrate 32 and, more specifically, conductive paths 64. Electrical connection is established, for example, via electrical connectors or contacts 62, such as I/O pins or spring fingers, wire bonds, electrical nodes, and/or other suitable electrical connectors. In one embodiment, printhead dies 40 include electrical contacts 41 which form I/O bond pads. As such, electronic interface system 60 includes electrical connectors, for example, wire bond leads 68, which electrically couple electrical contact pads 66 with electrical contacts 41 of printhead dies 40.

Conductive paths 64 transfer electrical signals between electronic controller 20 and printhead dies 40. More specifically, conductive paths 64 define transfer paths for power, ground, and data among and/or between printhead dies 40 and electrical controller 20. In one embodiment, data includes print data and non-print data.

In one embodiment, as illustrated in FIG. 6, substrate 32 includes a plurality of layers 33 each formed of a ceramic material. As such, substrate 32 includes circuit patterns which pierce layers 33 to form conductive paths 64. While substrate 32 is illustrated as including layers 33, it is, however, within the scope of the present invention for substrate 32 to be formed of a solid pressed ceramic material. As such, conductive paths are formed, for example, as thin-film metallized layers on the pressed ceramic material.

While conductive paths 64 are illustrated as terminating at first side 321 and second side 322 of substrate 32, it is, however, within the scope of the present invention for conductive paths 64 to terminate at other sides of substrate 32. In addition, one or more conductive paths 64 may branch from and/or lead to one or more other conductive paths 64. Furthermore, one or more conductive paths 64 may begin and/or end within substrate 32. Conductive paths 64 may be formed as described, for example, in U.S. Pat. No. 6,428,145, entitled "Wide-Array Printhead assembly with Internal Electrical Routing System" assigned to the assignee of the present invention.

It is to be understood that FIGS. 5 and 6 are simplified schematic illustrations of one embodiment of carrier 30, including substrate 32 and substructure 34. The illustrative routing of fluid passages 323 and 343 through substrate 32 and substructure 34, respectively, and conductive paths 64 through substrate 32, for example, has been simplified for clarity of the invention. Although various features of carrier 30, such as fluid passages 323 and 343 and conductive paths 64, are schematically illustrated as being straight, it is understood that design constraints could make the actual geometry more complicated for a commercial embodiment of printhead assembly 12. Fluid passages 323 and 343, for example, may have more complicated geometries to allow multiple colorants of ink to be channeled through carrier 30. In addition, conductive paths 64 may have more complicated routing geometries through substrate 32 to avoid contact with fluid passages 323 and to allow for electrical connector geometries other than the illustrated I/O pins. It is understood that such alternatives are within the scope of the present invention.

Figure 7:
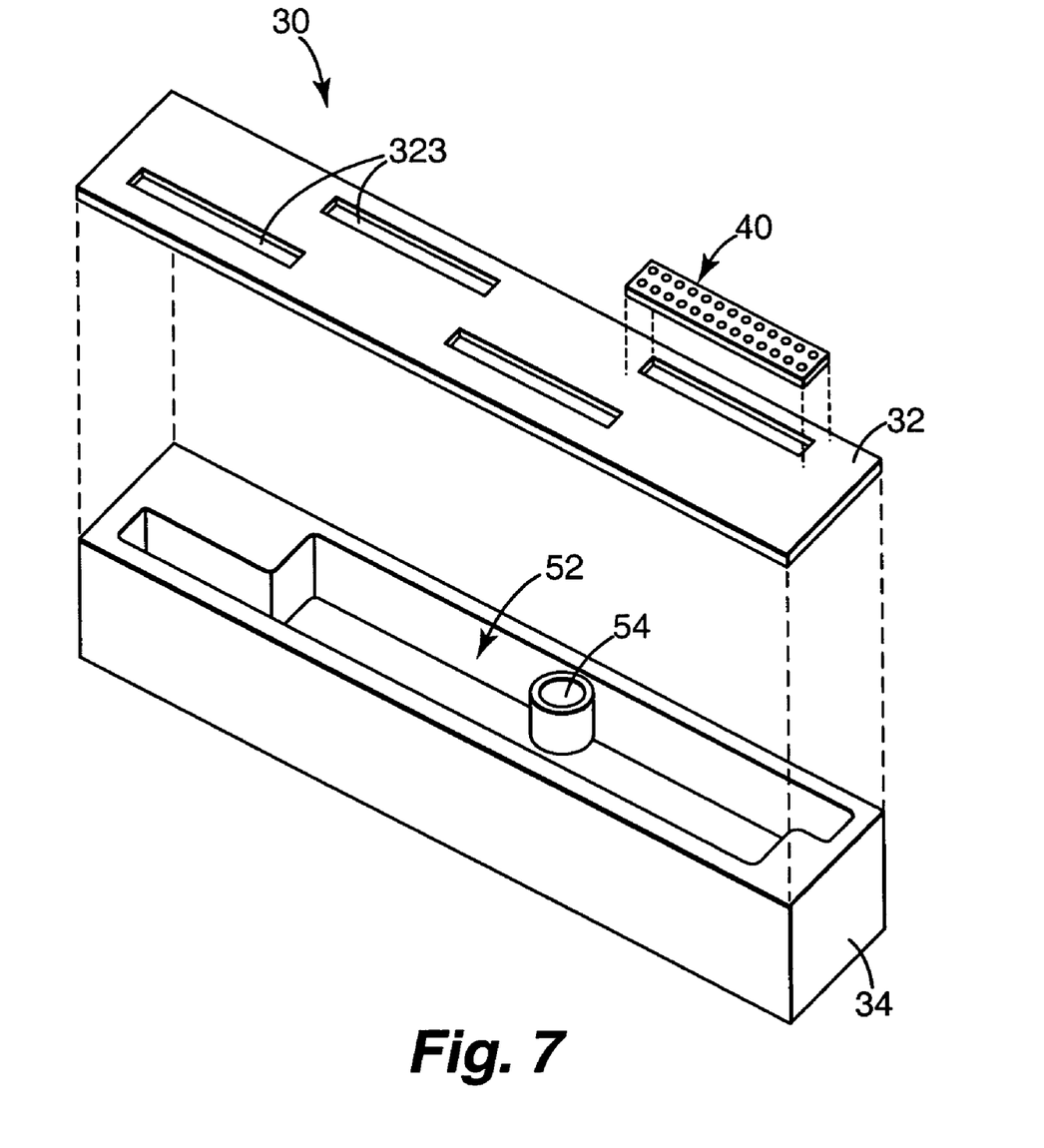
FIG. 7 is an exploded top perspective view illustrating one embodiment of a carrier for a printhead assembly.
Figure 8:
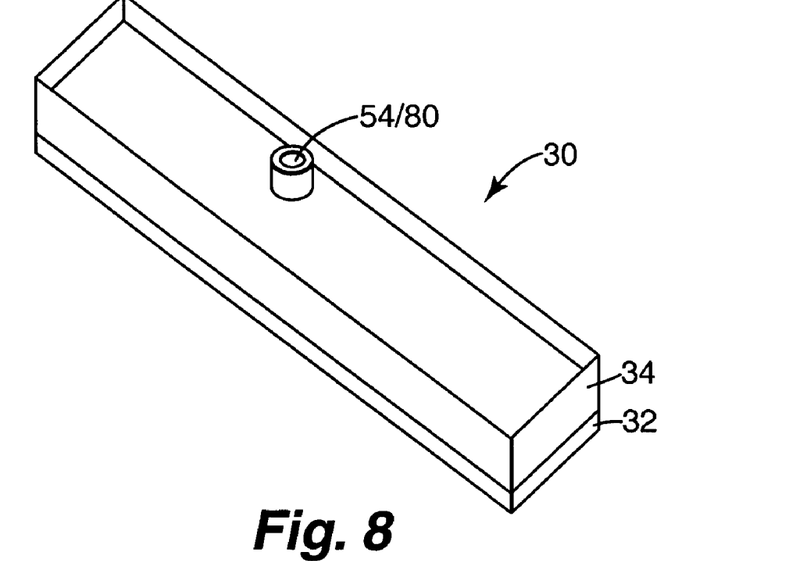
FIG. 8 is a bottom perspective view of the carrier of FIG. 7.

FIGS. 7 and 8 illustrate one embodiment of carrier 30 including substrate 32 and substructure 34. As described above, substrate 32 includes a plurality of fluid passages 323. Printhead dies 40 are mounted on substrate 32 such that each printhead die 40 communicates with one fluid passage 323. In addition, substructure 34 has fluid manifold 52 defined therein and includes fluid port 54. As such, substrate 32 forms a first side of carrier 30 and substructure 34 forms a second side of carrier 30 opposite the first side thereof. Thus, fluid passages 323 communicate with the first side of carrier 30 and fluid port 54 communicates with the second side of carrier 30. Substructure 34 supports substrate 32 such that fluid from fluid port 54 is distributed to fluid passages 323 and printhead dies 40 through fluid manifold 52.

Figure 9:
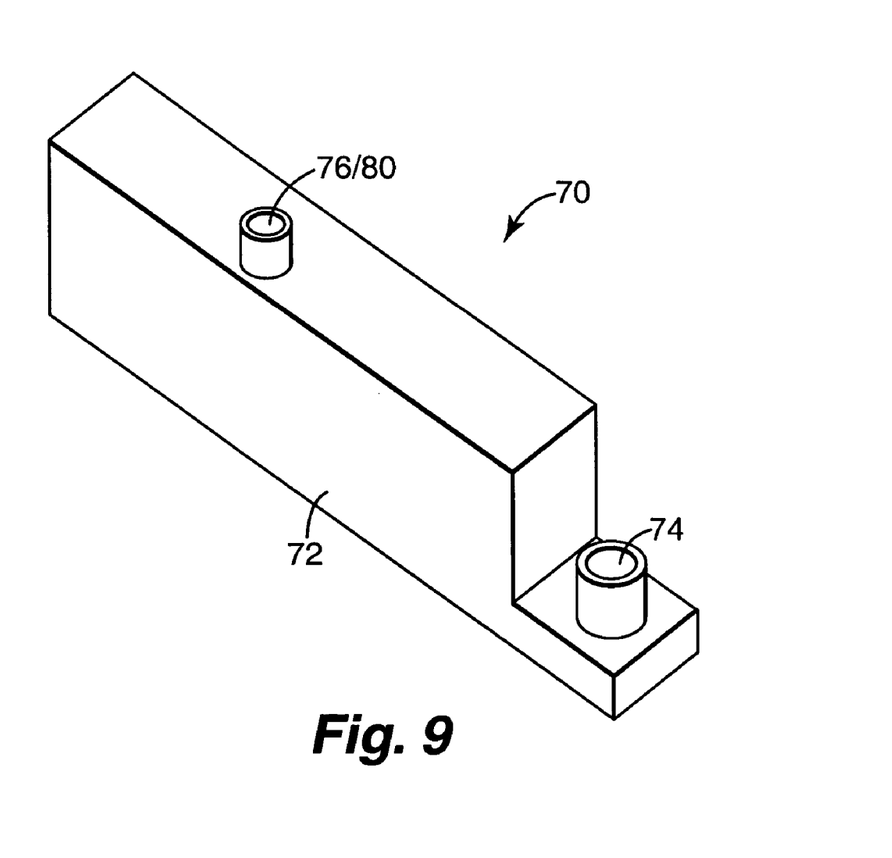
FIG. 9 is a top perspective view illustrating one embodiment of a fluid delivery assembly for a printhead assembly.

In one embodiment, as illustrated in FIG. 9, fluid delivery system 50 includes a fluid delivery assembly 70. Fluid delivery assembly 70 receives fluid from a fluid source and, in one embodiment, regulates a pressure of the fluid and filters the fluid for delivery to carrier 30. Fluid delivery assembly 70 is coupled with carrier 30 so as to communicate, in one embodiment, pressure regulated and filtered fluid with fluid manifold 52 of carrier 30.

In one embodiment, fluid delivery assembly 70 includes a housing 72, a fluid inlet 74, and a fluid outlet 76. Fluid inlet 74 communicates with a supply of fluid such as reservoir 15 of ink supply assembly 14 (FIG. 1). In one embodiment, fluid delivery assembly 70 includes a chamber which communicates with fluid inlet 74 and fluid outlet 76 such that fluid received at fluid inlet 74 is supplied to fluid outlet 76. Fluid outlet 76 communicates with fluid port 54 of carrier 30 such that fluid from fluid delivery assembly 70 is supplied to fluid manifold 52 of carrier 30.

Fluid outlet 76 of fluid delivery assembly 70 and fluid port 54 of carrier 30 form a fluid interconnect 80 which fluidically couples fluid delivery assembly 70 with fluid manifold 52 of carrier 30. As such, fluid outlet 76 constitutes a fluid coupling associated with fluid delivery assembly 70 and fluid port 54 constitutes a fluid coupling associated with carrier 30. Thus, the fluid coupling of fluid delivery assembly 70 mates with the fluid coupling of carrier 30 to deliver fluid from fluid delivery assembly 70 to carrier 30. Accordingly, a single fluid connection is established between fluid delivery assembly 70 and carrier 30 with fluid interconnect 80.

Figure 10:
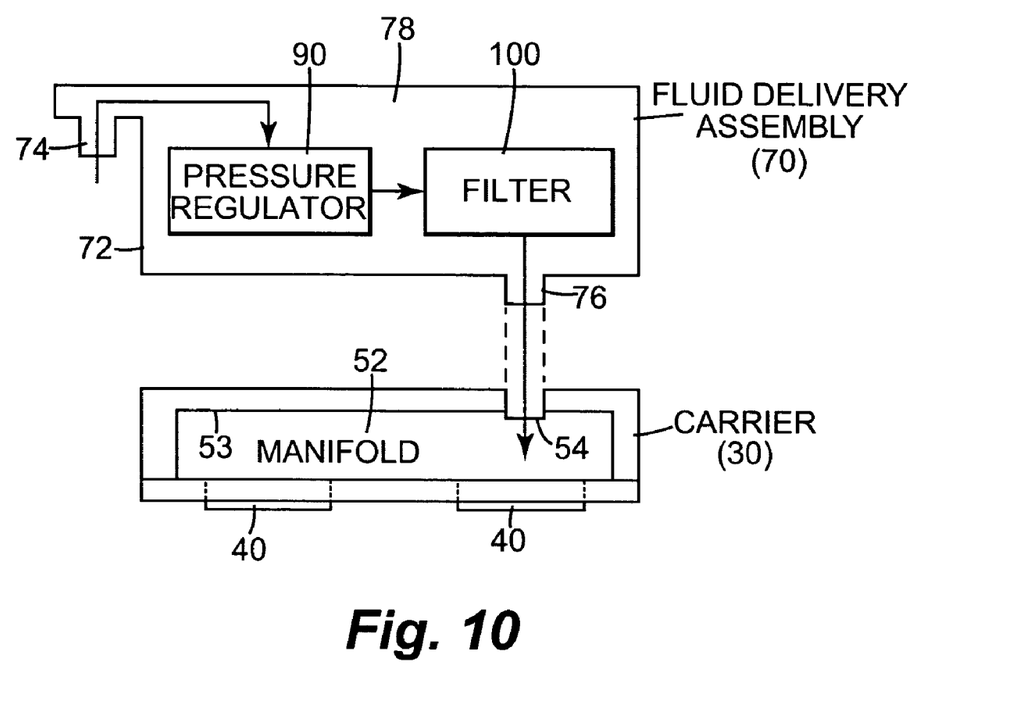
FIG. 10 is a schematic illustration of one embodiment of a fluid delivery assembly and a carrier for a printhead assembly.

In one embodiment, as illustrated schematically in FIG. 10, fluid delivery assembly 70 includes a pressure regulator 90 and a filter 100. Pressure regulator 90 and filter 100 are contained within a chamber 78 of housing 72. In one embodiment, pressure regulator 90 receives fluid from fluid inlet 74 and regulates a pressure of the fluid for delivery to carrier 30 and printhead dies 40. In addition, filter 100 receives pressure regulated fluid and filters the fluid before delivery to carrier 30 and printhead dies 40. In one embodiment, fluid from filter 100 is supplied to fluid manifold 52 of carrier 30 via fluid outlet 76 of fluid delivery assembly 70 and fluid port 54 of carrier 30.

While fluid manifold 52 of carrier 30 is illustrated as including one fluid chamber, it is understood that fluid manifold 52 may include multiple fluid chambers. Carrier 30 including multiple fluid chambers is described, for example, in U.S. patent application Ser. No. 10/283,836 and U.S. patent application Ser. No. 10/283,860, both assigned to the assignee of the present invention, and incorporated herein by reference. As such, fluid delivery assembly 70 may include fluid inlet 74, fluid interconnect 80, pressure regulator 90, and filter 100 for each fluid chamber.

Figure 11:
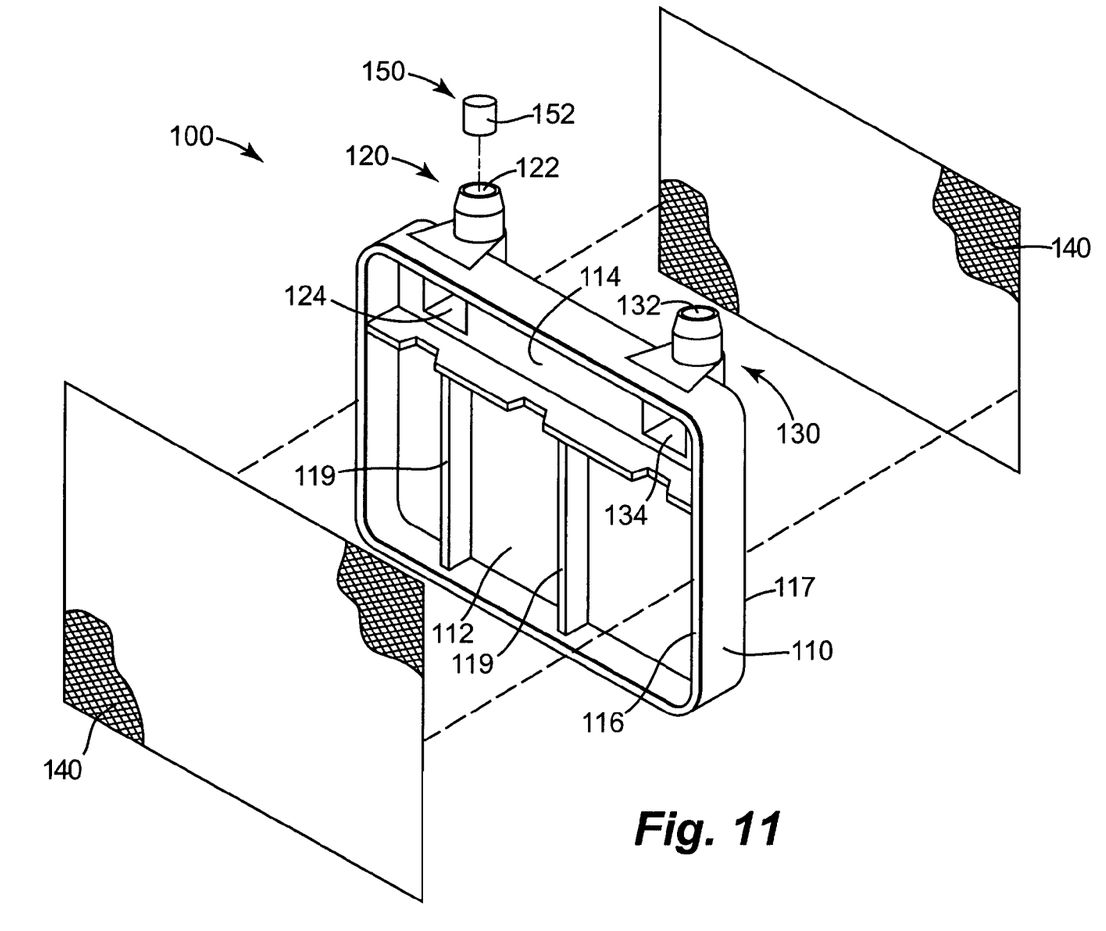
FIG. 11 is an exploded perspective view illustrating one embodiment of a filter for a printhead assembly.

FIG. 11 illustrates one embodiment of filter 100. Filter 100 includes a frame 110 having an opening 112 formed therein, fluid fittings 120 and 130 associated with frame 110, and filter material 140 enclosing opening 112 of frame 110. In one embodiment, frame 110 has a fluid passage 114 formed therein which communicates with opening 112. As such, filter material 140 also encloses fluid passage 114 of frame 110. In addition, fluid fittings 120 and 130 are associated with frame 110 so as to communicate with fluid passage 114, as described below.

In one embodiment, fluid fittings 120 and 130 each include a respective fluid port 122 and 132, and a respective fluid passage 124 and 134 communicated with the respective fluid port 122 and 132. Fluid fittings 120 and 130 are associated with frame 110 such that fluid passages 124 and 134 of fluid fittings 120 and 130 communicate with fluid passage 114 of frame 110. As such, fluid passages 124 and 134 of fluid fittings 120 and 130 communicate with opening 112 of frame 110 via fluid passage 114 of frame 110.

In one embodiment, frame 110 has a first face 116 and a second face 117. Second face 117 is opposite of first face 116 and, in one embodiment, oriented substantially parallel with first face 116. In one embodiment, opening 112 communicates with first face 116 and second face 117. As such, filter material 140 is provided on first face 116 and second face 117 of frame 110.

In one embodiment, filter material 140 is secured to first face 116 and second face 117 of frame 110 around a perimeter of opening 112. In addition, frame 110 includes one or more separators 119 which extend within opening 112 between opposite sides of opening 112. As such, separators 119 prevent filter material 140 provided on first face 116 and second face 117 of frame 110 from contacting within opening 112.

In one embodiment, as illustrated in FIG. 11, frame 110 has a substantially rectangular shape. In addition, opening 112 has a substantially rectangular shape. As such, filter material 140 is secured to frame 110 around a perimeter of the substantially rectangular shape of opening 112. In addition, separators 119 extend within opening 112 between opposite sides of the substantially rectangular shape of frame 110.

As illustrated in the embodiment of FIG. 11, fluid fittings 120 and 130 are spaced from each other and extend from one side of frame 110. In one embodiment, fluid port 122 of fluid fitting 120 communicates with a supply of fluid within fluid delivery assembly 70 (FIG. 10) and fluid port 132 of fluid fitting 130 communicates with fluid manifold 52 of carrier 30 (FIG. 10).

In one embodiment, as described below, air passes through filter material 140 before filter material 140 is wetted by liquid ink and air is prevented from passing through filter material 140 when filter material 140 is wetted by liquid ink. In one embodiment, filter material 140 includes, for example, a mesh material having a mesh size which prevents air from passing therethrough when the mesh material is wetted by liquid ink. More specifically, while liquid ink may pass through the openings of the mesh material, under normal operating pressures, air bubbles will not pass through the openings of the mesh material when the mesh material is wetted by the liquid ink. In one embodiment, for example, filter material 140 has a mesh size in a range of approximately 2 microns to approximately 20 microns.

In one embodiment, a permeable material 150 is communicated with fluid port 122 of fluid fitting 120. As such, fluid that passes through fluid port 122 of fluid fitting 120 passes through permeable material 150. In one embodiment, as described below, before permeable material 150 is wetted by liquid ink, permeable material allows air to pass through fluid port 122. However, when permeable material is wetted by liquid ink, permeable material 150 prevents air from passing through fluid port 122.

In one embodiment, as illustrated in FIG. 11, permeable material 150 includes a porous plug 152. In one embodiment, porous plug 152 is fitted within fluid port 122 of fluid fitting 120 such that fluid that passes through fluid port 122 passes through porous plug 152. In one embodiment, porous plug 152 is impregnated with a clogging agent which coagulates when wetted by a liquid. As such, air is prevented from passing through porous plug 152 when porous plug 152 is wetted by liquid ink. Material suitable for porous plug 152 is available, for example, from Porex Corporation of Fairburn, Ga.

Figure 12:
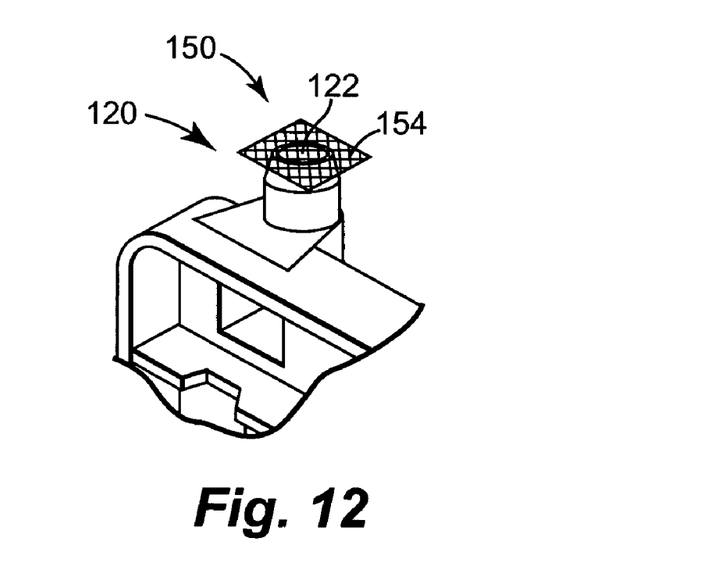
FIG. 12 is a perspective view illustrating another embodiment of a portion of a filter for a printhead assembly.

In another embodiment, as illustrated in FIG. 12, permeable material 150 includes a mesh material 154. In one embodiment, mesh material 154 is fit over fluid port 122 of fluid fitting 120 such that fluid that passes through fluid port 122 passes through mesh material 154. In one embodiment, mesh material 154 is selected so as to have a mesh size which prevents air from passing therethrough when mesh material 154 is wetted by liquid ink. More specifically, while liquid ink may pass through the openings of mesh material 154, under normal operating pressures, air bubbles will not pass through the openings of mesh material 154 when mesh material 154 is wetted by the liquid ink.

In one embodiment, for example, mesh material 154 has a mesh size in a range of approximately 2 microns to approximately 20 microns. In addition, in one embodiment, the mesh size of mesh material 154 is selected such that the pressure drop through mesh material 154 is less than the pressure drop through filter material 140. In one exemplary embodiment, mesh material 154 has a mesh size of approximately 7 microns and filter material 140 has a mesh size of approximately 12 microns. As such, the pressure drop through mesh material 154 is less than the pressure drop through filter material 140.

Figure 13A:
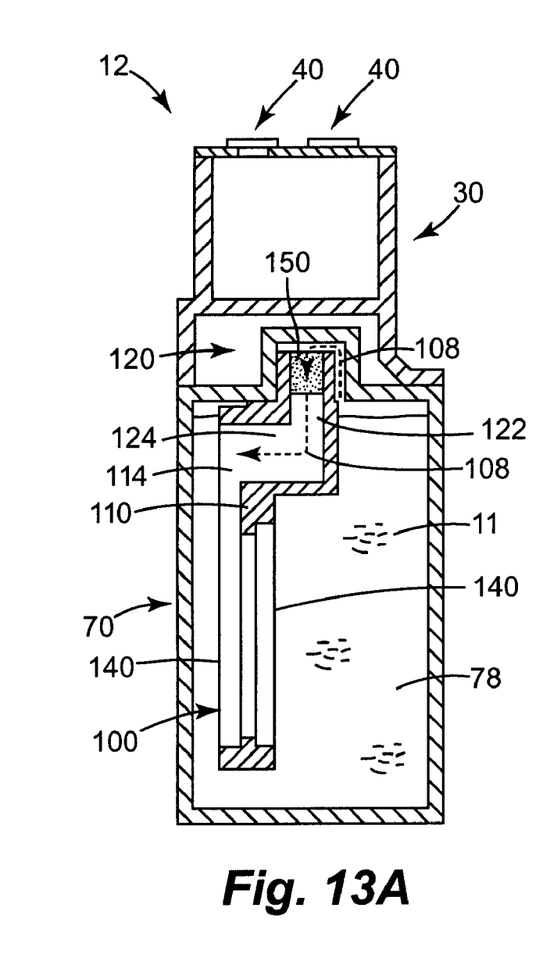
FIGS. 13A and 13B are schematic cross-sectional views of one embodiment of a printhead assembly oriented for filling of the printhead assembly with liquid ink.
Figure 13B:
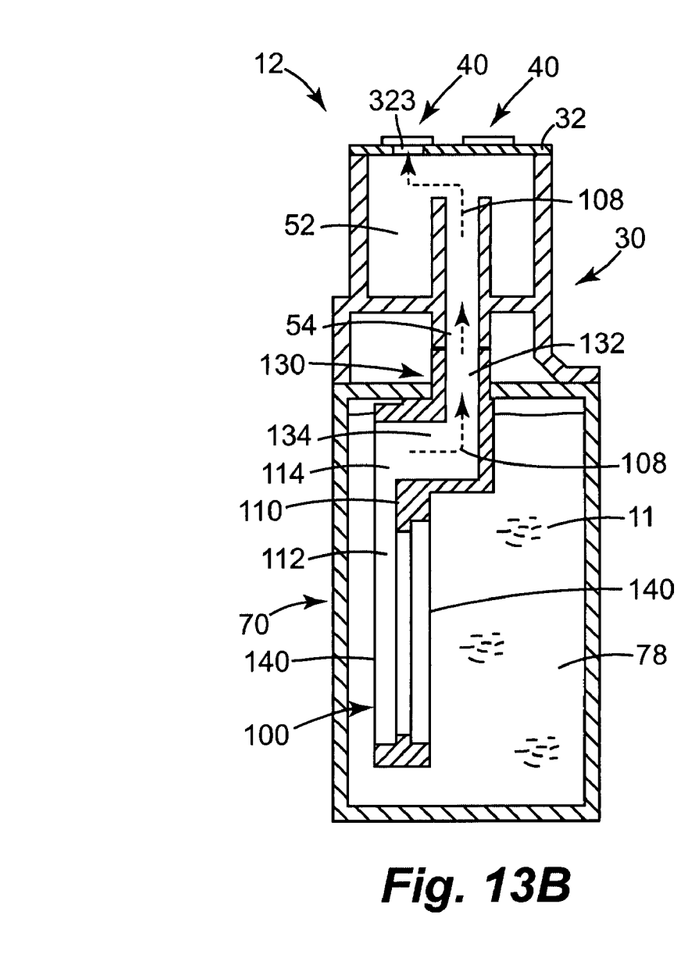

FIGS. 13A and 13B illustrate one embodiment of filling printhead assembly 12 including, more specifically, chamber 78 of fluid delivery assembly 70 with liquid ink 11. In one embodiment, during filling of printhead assembly 12 with liquid ink 11, printhead assembly 12 is oriented such that carrier 30 and printhead dies 40 are above fluid delivery assembly 70. While chamber 78 of fluid delivery assembly 70 is being filled with liquid ink 11, air within chamber 78 is vented (as identified by dashed arrows 108) through fluid passage 134 and fluid port 132 of fluid fitting 130 to fluid manifold 52 of carrier 30 through fluid port 54 and escapes through fluid passages 323 of substrate 32 and nozzles 13 (FIG. 7) of printhead dies 40.

Before filter material 140 of filter 100 is wetted by liquid ink 11, air passes through filter material 140 into opening 112 and into fluid passage 114 of frame 110. As such, air is vented through fluid fitting 130, as described above. However, as filter material 140 is wetted by liquid ink 11, air is prevented from passing through the wetted filter material 140. In addition, in one embodiment, as filter material 140 is wetted by liquid ink 11, capillary action of filter material 140 causes liquid ink 11 to wick up filter material 140 and wet filter material 140 to a level higher than the actual level of liquid ink 11 within chamber 78 of fluid delivery assembly 70. Thus, as liquid ink 11 within fluid delivery assembly 70 reaches the level illustrated in FIGS. 13A and 13B, air within fluid delivery assembly 70 can only pass (as identified by dashed arrows 108) through fluid port 122, including through permeable material 150, and fluid passage 124 of fluid fitting 120 to fluid passage 114 of frame 110. As such, air passes through fluid passage 114 of frame 110 and escapes through fluid passage 134 and fluid port 132 of fluid fitting 130 to fluid manifold 52 of carrier 30, as described above.

As the level of liquid ink 11 within fluid delivery assembly 70 exceeds the level illustrated in FIGS. 13A and 13B, permeable material 150 associated with fluid port 122 (including, for example, porous plug 152 or mesh material 154) is wetted by liquid ink 11. As such, air is prevented from passing through permeable material 150. In addition, foreign particles within chamber 78 of fluid delivery assembly 70 are prevented, by permeable material 150, from passing through fluid fitting 120 into filter 100 and into fluid manifold 52 of carrier 30.

Figure 14:
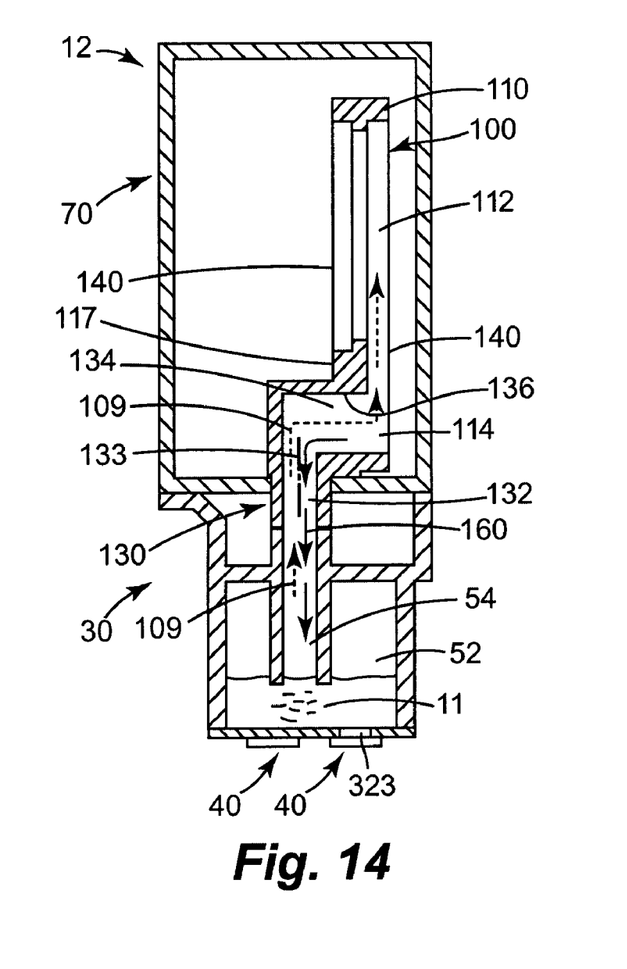
FIG. 14 is a schematic cross-sectional view of one embodiment of a printhead assembly oriented for operation of the printhead assembly and including one embodiment of a filter for the printhead assembly.

As illustrated in the embodiment of FIG. 14, during operation of printhead assembly 12, printhead assembly 12 is oriented such that carrier 30 and printhead dies 40 are below fluid delivery assembly 70. As such, a fluid delivery path (as identified by solid arrows 160) is defined through filter 100 including through filter material 140, through opening 112 and fluid passage 114 of frame 110, through fluid passage 134 and fluid port 132 of fluid fitting 130, through fluid port 54 of carrier 30, and into fluid manifold 52 of carrier 30. As such, fluid fitting 130 of filter 100 constitutes fluid outlet 76 of fluid delivery assembly 70 (FIG. 10). Thus, printhead dies 40 are supplied with liquid ink 11 through fluid passages 323 (FIG. 7), as described above.

In one embodiment, as illustrated in FIG. 14, air within fluid manifold 52 of carrier 30 and fluid delivery path 160 is collected within filter 100. More specifically, as the level of liquid ink 11 falls below the level illustrated in FIG. 14, air within fluid manifold 52 passes (as identified by dashed arrows 109) through fluid port 54 of carrier 30, through fluid port 132 and fluid passage 134 of fluid fitting 130, and through fluid passage 114 and into opening 112 of frame 110 of filter 100. Since filter material 140 is wetted by liquid ink 11, air is prevented from passing through filter material 140 to chamber 78 of fluid delivery assembly 70. As such, air is trapped within filter 100. Thus, operating pressure of printhead assembly 12 is more readily regulated by pressure regulator 90 (FIG. 10) since the addition of air to chamber 78 of fluid delivery assembly 70 is minimized.

Figure 15:
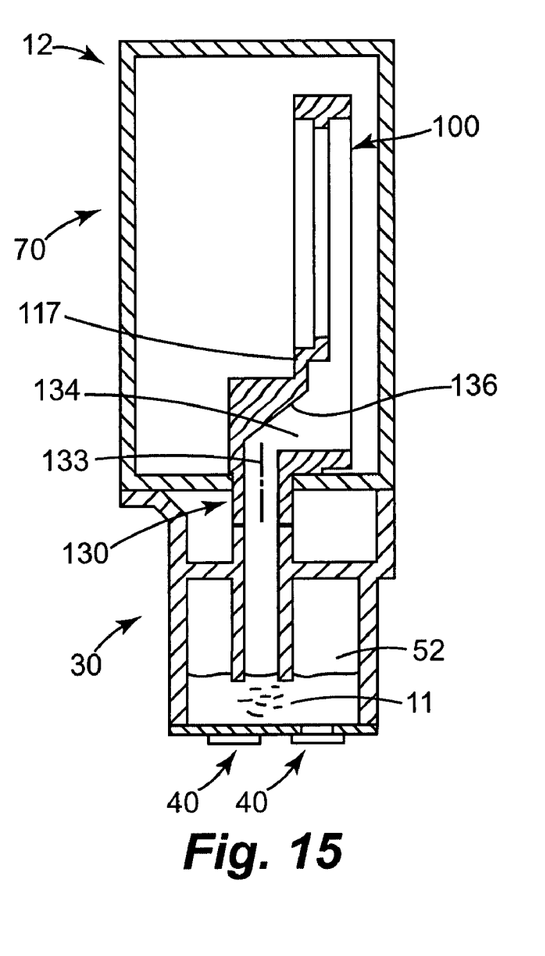
FIG. 15 is a schematic cross-sectional view of one embodiment of a printhead assembly oriented for operation of the printhead assembly and including another embodiment of a filter for the printhead assembly.

As illustrated in the embodiments of FIGS. 14 and 15, fluid port 132 has a longitudinal axis 133 and frame 110 is oriented substantially parallel with longitudinal axis 133. In addition, fluid port 132 of fluid fitting 130 is offset from frame 110 of filter 100. More specifically, fluid port 132 is offset from frame 110 in a direction substantially perpendicular to longitudinal axis 133 of fluid port 132. In one embodiment, fluid fitting 130 extends from second face 117 of frame 110 such that fluid passage 134 of fluid fitting 130 extends between fluid port 132 of fluid fitting 130 and fluid passage 114 of frame 110. As such, fluid passage 134 of fluid fitting 130 extends generally perpendicular to longitudinal axis 133 of fluid port 132.

As illustrated in the embodiments of FIGS. 14 and 15, fluid passage 134 of fluid fitting 130 has a surface 136 oriented at an angle to longitudinal axis 133 of fluid port 132. In one embodiment, as illustrated in FIG. 14, the angle of surface 136 is approximately a right angle. In another embodiment, as illustrated in FIG. 15, the angle of surface 136 is an acute angle. In one embodiment, for example, the angle of surface 136 is approximately 30 degrees.

Figure 16A:
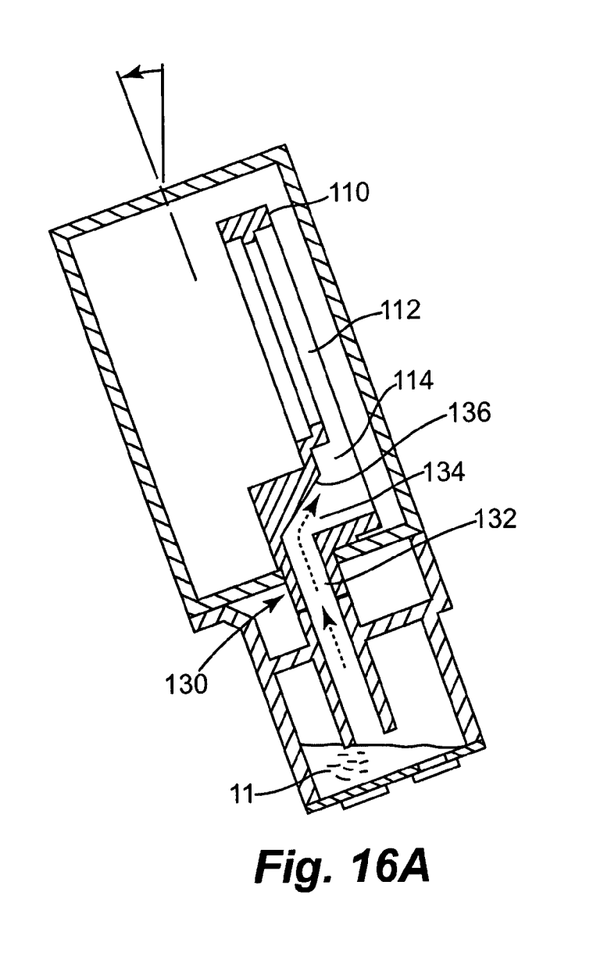
FIGS. 16A and 16B are schematic cross-sectional views of the printhead assembly of FIG. 15 oriented at negative and positive angles relative to a vertical orientation.
Figure 16B:
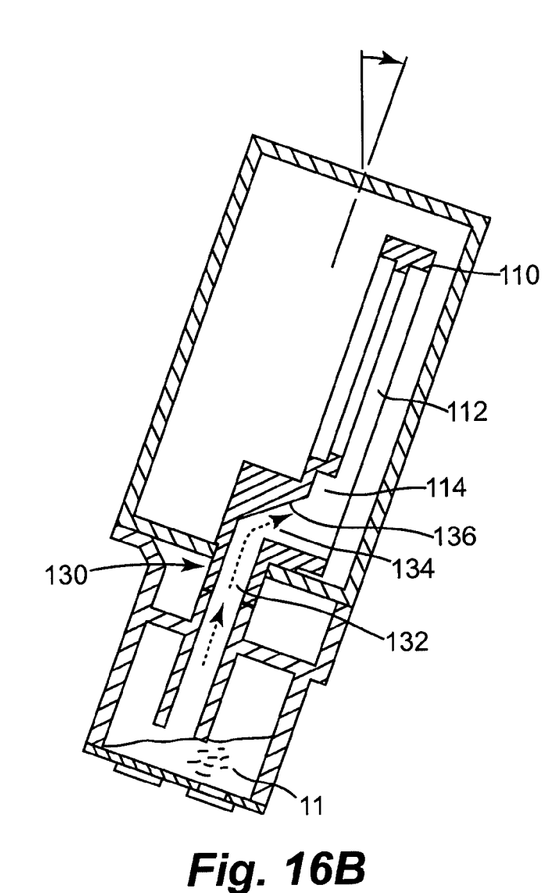

As illustrated in the embodiments of FIGS. 16A and 16B, by orienting surface 136 of fluid passage 134 at an acute angle relative to the longitudinal axis of fluid port 132, surface 136 of fluid passage 134 becomes a sloped surface. As such, fluid passage 134 can direct air from fluid port 132 to fluid passage 114 and, therefore, opening 112 of frame 110 when printhead assembly 12 is oriented at an angle relative to a vertical axis or orientation. Printhead assembly 12 may be oriented at an angle relative to a vertical axis or orientation, for example, when arranged around a cylindrical paper guide.

For example, as illustrated in the embodiment of FIG. 16A, when printhead assembly 12 is oriented at a negative angle relative to a vertical orientation, surface 136 of fluid passage 134 can direct air from fluid port 132 to opening 112 of frame 110 without creating an area where air may become trapped in fluid passage 134 as air is vented from fluid manifold 52 and through fluid fitting 130 to opening 112 of frame 110. In addition, as illustrated in the embodiment of FIG. 16B, when printhead assembly 12 is oriented at a positive angle relative to a vertical orientation, surface 136 of fluid passage 134 can direct air from fluid port 132 to opening 112 of frame 110 without creating an area where air may become trapped in fluid passage 134 as air is vented from fluid manifold 52 and through fluid fitting 130 to opening 112 of frame 110.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A filter for a printhead assembly, the filter comprising:
   a frame having an opening and a fluid passage communicated with the opening formed therein;
   filter material enclosing the opening and the fluid passage of the frame;
   a first fluid port communicated with the fluid passage of the frame;
   a permeable material communicated with the first fluid port; and
   a second fluid port spaced from the first fluid port and communicated with the fluid passage of the frame,
   wherein the permeable material includes a porous plug fitted within the first fluid port, wherein the porous plug is impregnated with a clogging agent.

2. A printhead assembly, comprising:
   a carrier having a fluid manifold defined therein;
   a printhead die mounted on the carrier and communicated with the fluid manifold; and
   a fluid delivery assembly coupled with the carrier and including a filter including a frame having an opening and a fluid passage communicated with the opening formed therein, filter material enclosing the opening and the fluid passage of the frame, first and second fluid ports communicated with the fluid passage, and a permeable material communicated with the first fluid port,
   wherein the second fluid port of the filter communicates with the fluid manifold of the carrier,
   wherein the permeable material of the filter includes a porous plug fitted within the first fluid port, wherein the porous plug is impregnated with a clogging agent.

3. A filter for a printhead assembly, the filter comprising:
   a frame having a first face and a second face opposite the first face, an opening communicated with the first face and the second face, and a fluid passage communicated with the opening;
   filter material provided on each the first face and the second face of the frame and enclosing the opening and the fluid passage of the frame;
   a first fluid port communicated with the fluid passage of the frame;
   a permeable material provided in a fluid path of the first fluid port; and
   a second fluid port spaced from the first fluid port and communicated with the fluid passage of the frame,
   wherein the permeable material includes a porous plug fitted within the first fluid port, wherein the porous plug is impregnated with a clogging agent.

4. The filter of claim 3, wherein the fluid passage of the frame is adapted to direct air from the first fluid port to the second fluid port.

5. The filter of claim 3, wherein the permeable material is adapted to allow air to pass therethrough before the permeable material is wetted by liquid ink and prevent air from passing therethrough when the permeable material is wetted by the liquid ink.

6. The filter of claim 3, wherein the permeable material includes a mesh material.

7. The filter of claim 3, wherein the filter material is secured to the frame around a perimeter of the opening.

8. The filter of claim 3, wherein the filter material has a mesh size in a range of approximately 2 microns to approximately 20 microns.

9. The filter of claim 3, wherein the filter material is adapted to allow liquid ink to pass therethrough, and wherein the filter material is adapted to prevent air from passing therethrough when the filter material is wetted by the liquid ink.

10. The filter of claim 9, wherein the filter material is adapted to allow air to pass therethrough before the filter material is wetted by the liquid ink.

11. The filter of claim 3, wherein the frame has a substantially rectangular shape, and wherein the first fluid port and the second fluid port extend from a side of the substantially rectangular shape.

12. The filter of claim 3, wherein the fluid passage of the frame communicates with the opening and one of the first face and the second face of the frame.

13. The filter of claim 3, wherein the first fluid port communicates with the fluid passage of the frame and wherein the second fluid port communicates externally of the frame.

14. The filter of claim 3, wherein the second fluid port communicates with the fluid passage of the frame and wherein the second fluid port communicates externally of the frame.

15. A printhead assembly, comprising:
    a carrier having a fluid manifold defined therein;
    a printhead die mounted on the carrier and communicated with the fluid manifold; and
    a fluid delivery assembly coupled with the carrier and including a filter including a frame having a first face and a second face opposite the first face, an opening communicated with the first face and the second face, and a fluid passage communicated with the opening, filter material provided on each the first face and the second face of the frame and enclosing the opening and the fluid passage of the frame, first and second fluid ports communicated with the fluid passage, and a permeable material provided in a fluid path of the first fluid port,
    wherein the second fluid port of the filter communicates with the fluid manifold of the carrier,
    wherein the permeable material of the filter includes a porous plug fitted within the first fluid port, wherein the porous plug is impregnated with a clogging agent.

16. The printhead assembly of claim 15, wherein the fluid passage of the frame is adapted to direct air from the first fluid port to the second fluid port.

17. The printhead assembly of claim 15, wherein the permeable material of the filter is adapted to allow air to pass therethrough before the permeable material is wetted by liquid ink and prevent air from passing therethrough when the permeable material is wetted by the liquid ink.

18. The printhead assembly of claim 15, wherein the permeable material of the filter includes a mesh material.

19. The printhead assembly of claim 15, wherein the filter material of the filter is adapted to allow liquid ink to pass therethrough, and wherein the filter material of the filter is adapted to prevent air from passing therethrough when the filter material is wetted by the liquid ink.

20. The printhead assembly of claim 19, wherein the filter material of the filter is adapted to allow air to pass therethrough before the filter material is wetted by the liquid ink.

21. The printhead assembly of claim 15, wherein the fluid passage of the frame of the filter communicates with the opening and one of the first face and the second face of the frame of the filter.

22. The printhead assembly of claim 15, wherein the first fluid port of the filter communicates with the fluid passage of the frame of the filter and wherein the first fluid port of the filter communicates externally of the frame of the filter.

23. The printhead assembly of claim 15, wherein the second fluid port of the filter communicates with the fluid passage of the frame of the filter and wherein the second fluid port of the filter communicates externally of the frame of the filter.

\* \* \* \* \*

UNITED STATES PATENT AND TRADEMARK OFFICE
CERTIFICATE OF CORRECTION

| | |
|---|---|
| PATENT NO. | : 7,188,942 B2 |
| APPLICATION NO. | : 10/635409 |
| DATED | : March 13, 2007 |
| INVENTOR(S) | : Mark Haines et al. |

Page 1 of 1

It is certified that error appears in the above-identified patent and that said Letters Patent is hereby corrected as shown below:

In column 1, line 7, delete "fled" and insert -- filed --, therefor.

In column 11, line 55, in Claim 3, delete "opening:" and insert -- opening; --, therefor.

In column 12, line 33, in Claim 13, delete "second" and insert -- first --, therefor.

Signed and Sealed this

Twenty-first Day of April, 2009

JOHN DOLL
*Acting Director of the United States Patent and Trademark Office*